US009263497B2

(12) United States Patent
Maekawa

(10) Patent No.: US 9,263,497 B2
(45) Date of Patent: Feb. 16, 2016

(54) MANUFACTURING METHOD OF BACK ILLUMINATION CMOS IMAGE SENSOR DEVICE USING WAFER BONDING

(71) Applicant: Renesas Electronics Corporation, Kawasaki-shi, Kanagawa (JP)

(72) Inventor: Kazuyoshi Maekawa, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/082,976

(22) Filed: Nov. 18, 2013

(65) Prior Publication Data

US 2014/0141560 A1  May 22, 2014

(30) Foreign Application Priority Data

Nov. 21, 2012  (JP) ................. 2012-254926

(51) Int. Cl.
*H01L 31/18* (2006.01)
*H01L 27/146* (2006.01)

(52) U.S. Cl.
CPC ........ *H01L 27/1469* (2013.01); *H01L 27/1464* (2013.01); *H01L 27/14632* (2013.01); *H01L 27/14634* (2013.01); *H01L 27/14687* (2013.01)

(58) Field of Classification Search
CPC ........ H01L 21/02; H01L 27/14; H01L 27/146
USPC .................................................. 438/64, 106
See application file for complete search history.

(56) References Cited

U.S. PATENT DOCUMENTS

| 5,413,940 | A | * | 5/1995 | Lin et al. ................ 438/14 |
| 6,475,072 | B1 | * | 11/2002 | Canaperi et al. ........ 451/65 |
| 2008/0286910 | A1 | | 11/2008 | Yamazaki et al. |
| 2010/0308455 | A1 | * | 12/2010 | Kim et al. ................ 257/734 |
| 2011/0254095 | A1 | | 10/2011 | Kamata et al. |
| 2012/0088352 | A1 | * | 4/2012 | Beneyton et al. ........ 438/459 |
| 2012/0217600 | A1 | * | 8/2012 | Hongo et al. ............ 257/432 |

FOREIGN PATENT DOCUMENTS

| JP | 2009-004741 A | 1/2009 |
| JP | 2011-243959 A | 12/2011 |

* cited by examiner

*Primary Examiner* — Evan Pert
*Assistant Examiner* — Changhyun Yi
(74) *Attorney, Agent, or Firm* — Foley & Lardner LLP

(57) ABSTRACT

Disclosed is a manufacturing method of a semiconductor device including a step of attaching semiconductor wafers together, in which it is prevented that the bonding strength between the attached semiconductor wafers may be decreased due to a void caused between the two semiconductor wafers. Moisture, etc., adsorbed to the surfaces of the semiconductor wafers is desorbed by performing a heat treatment on the semiconductor wafers after cleaning the surfaces thereof with pure water. Subsequently, after a plasma treatment is performed on the semiconductor wafers, the two semiconductor wafers are attached together. The wafers are firmly bonded together by subjecting to a high-temperature heat treatment.

11 Claims, 8 Drawing Sheets

MANUFACTURING METHOD OF BACK ILLUMINATION CMOS IMAGE SENSOR DEVICE USING WAFER BONDING

CROSS-REFERENCE TO RELATED APPLICATIONS

The disclosure of Japanese Patent Application No. 2012-254926 filed on Nov. 21, 2012 including the specification, drawings and abstract is incorporated herein by reference in its entirety.

BACKGROUND

The present invention relates to a manufacturing method of a semiconductor device, and in particular, to a technique effective when applied to a manufacturing method of a semiconductor device including the step of attaching semiconductor wafers together.

In the step of forming a backside illumination CMOS (Complementary Metal Oxide Semiconductor) image sensor that is one type of image pickup devices to be used in digital still cameras, etc., it is known that, as a method of making up for the strength of a semiconductor wafer (semiconductor substrate) over which a device (semiconductor element) is formed, another semiconductor wafer is attached to the semiconductor wafer.

Patent Document 1 (Japanese Unexamined Patent Publication No. 2011-243959) describes that: before substrates are attached together, the surfaces of the substrates are cleaned by a wet treatment; and after a plasma treatment is performed on the surfaces thereof, a heat treatment is performed on the substrates. Patent Document 1 also describes that the substrates are attached together in a treatment chamber having a reduced pressure. However, it does not describe that the substrates are attached together in a state where the temperatures of the substrates are made to be room temperature (normal temperature).

Patent Document 2 (Japanese Unexamined Patent Publication No. 2009-4741) describes that: before and when substrates are bonded together, the substrates are placed in vacuum; and the organic components in the adhesive layer between the substrates are removed by heating the substrates in vacuum when the substrates are bonded together. However, it does not describe that the substrates are attached together in a state where the temperatures of the substrates are made to be room temperature (normal temperature).

Patent Documents

[Patent Document 1] Japanese Unexamined Patent Publication No. 2011-243959

[Patent Document 2] Japanese Unexamined Patent Publication No. 2009-4741

SUMMARY

Attachment of semiconductor wafers (hereinafter, simply referred to as wafers) is likely to be influenced by a warp or surface state of a wafer; however, when wafers are attached together under an atmosphere of normal temperature and normal pressure, it is difficult to manage the surface state of the wafer. If each treatment, such as cleaning of a wafer, temporary bonding of wafers together, or the like, is performed in the atmosphere without managing an atmosphere, etc., in which the each treatment is performed or a wafer is conveyed between the treatments, avoid is caused in the bonded interface because moisture and an adsorption gas adsorbed to the surface of a wafer is not removed before the bonding of wafers together. In addition, the temperatures of two wafers, which are to be bonded together, are not controlled or managed in a bonding step, so that there is the problem that the characteristic of a device may be deteriorated due to residual strain (residual stress) resulting from a difference between the temperatures of the wafers.

Other problems and new characteristics will become clear from the description and accompanying drawings of the present specification.

Of the preferred embodiments disclosed in the present application, outlines of the typical ones will be briefly described as follows.

In a semiconductor device according to one embodiment, after the surfaces of two semiconductor wafers are cleaned with pure water, a heat treatment is performed on each of the semiconductor wafers to desorb the moisture, etc., that is adsorbed to the surfaces of the semiconductor wafers. Subsequently, after a plasma treatment is performed on each of the semiconductor wafers, the two semiconductor wafers are attached together and then subjected to a high-temperature heat treatment.

According to one embodiment disclosed in the present application, the reliability of a semiconductor device can be improved.

DETAILED DESCRIPTION

Figure 1:
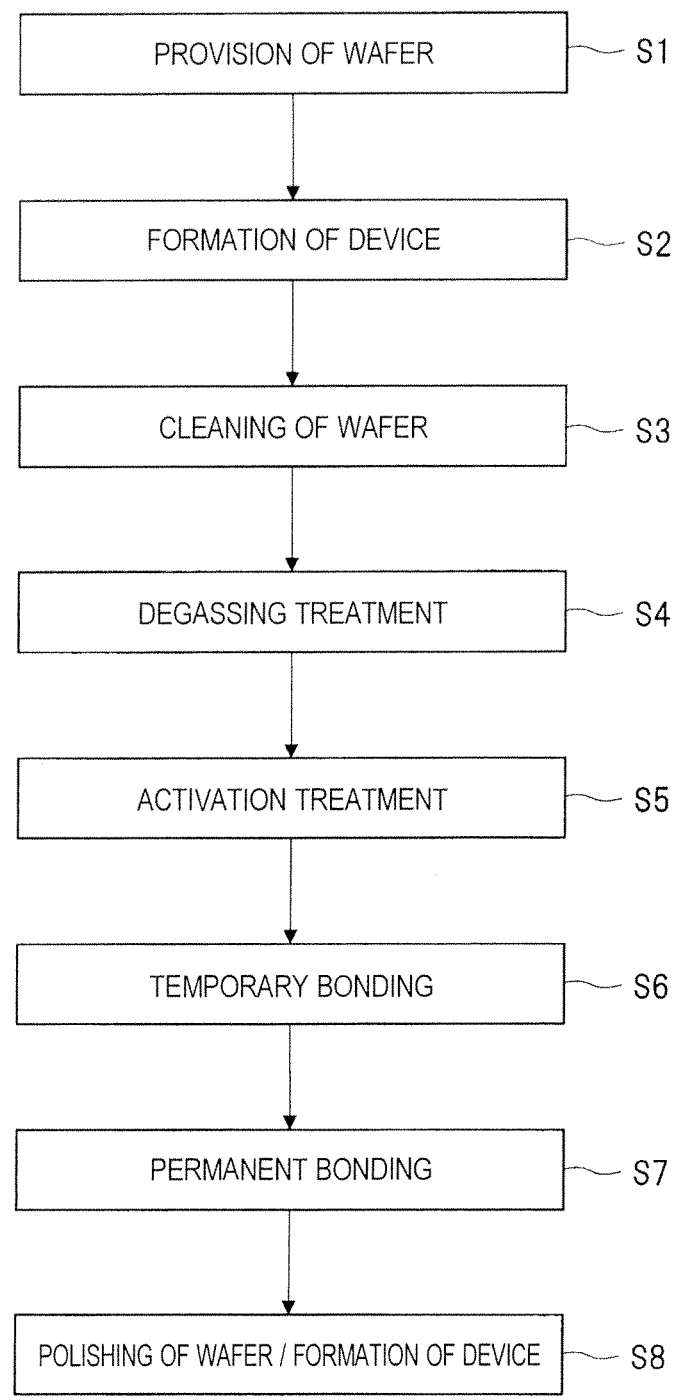
FIG. 1 illustrates a flow of manufacturing steps of a semiconductor device according to First Embodiment of the present invention.

Hereinafter, preferred embodiments will be described in detail based on the drawings. In each view for describing the embodiments, components having the same function will be denoted with the same reference numeral, and duplicative description thereof will be omitted. In the following embodiments, description of the same or similar parts will not be repeated in principle, unless particularly necessary.

In the views used in the following embodiments, even in a bird's-eye view, hatching lines are partially drawn for easy understanding of the views in some cases.

The reduced-pressure state and the reduced-pressure atmosphere referred to in the present application mean a vacuum state whose pressure is more reduced than normal pressure (atmospheric pressure).

(First Embodiment)

In the present embodiment, a manufacturing method of a semiconductor chip including a backside illumination CMOS image sensor will be described, the semiconductor chip being formed by attaching and bonding the surface (first surface) on the main surface side of a wafer (semiconductor substrate) over which a device is formed to the surface (second surface) on the main surface side of another wafer (semiconductor substrate). The image sensor is an image pickup device that forms an image of the light emitted from a target object onto the acceptance surface of the image sensor through an optical system and that photoelectrically converts the light and dark, generated by the light of the image, into an amount of charge and reads out the amount of charge to convert into an electrical signal.

In the backside illumination image sensor, by emitting, from the back surface side of a wafer (semiconductor substrate) on the main surface side of which a photodiode and an overlying wiring, etc., are formed, light onto the photodiode, the emitted light reaches a light receiving part without being blocked by the wiring or a transistor that is formed on the main surface side of the semiconductor substrate. Accordingly, an amount of received light can be made further large and the sensitivity of the image sensor can be further improved, in comparison with the case where light is emitted from the main surface side of a wafer.

However, the thickness of a wafer before being processed is, for example, approximately 750 μm, and hence if a wafer is used as it is without being processed, almost of the light emitted from the back surface side of the wafer cannot reach a light receiving part formed on the main surface side of the wafer. Accordingly, it is needed to improve the transmittance of emitted light by making the thickness of a wafer to be small, for example, to be approximately 3 μm; in this case, however, the strength of the wafer is decreased due to the thickness being made small. As a method of reinforcing the strength of the semiconductor device, it can be considered to attach another wafer to the main surface side of the wafer. When such a semiconductor device is manufactured, a step of attaching (bonding) wafers together is performed, and then the thickness of one of the wafers is made to be small. Herein, the light receiving part means a photodiode formed over the main surface of a first wafer.

Hereinafter, it is described along a flow of manufacturing steps illustrated in FIG. 1 that, when two wafers are bonded together, surface states of the wafers are improved by performing a heating step on each of the wafers before they are bonded together in order to improve the reliability of a semiconductor device. FIG. 1 illustrates a flow of manufacturing steps of a semiconductor device according to the present embodiment.

At first, a first wafer (first semiconductor substrate) and a second wafer (second semiconductor substrate) are provided as illustrated in Step S1 of FIG. 1. The first wafer is an SOI (Silicon On Insulator) substrate that has both an embedded oxide film over a semiconductor substrate comprised, for example, of monocrystalline silicon or monocrystalline silicon and a thin silicon layer over the embedded oxide film. The thickness of the first wafer is, for example, 750 μm. The second wafer is a substrate comprised, for example, of monocrystalline silicon or a substrate over which a device or a wiring is formed. The thickness of the second wafer is, for example, 750 μm.

Figure 2:
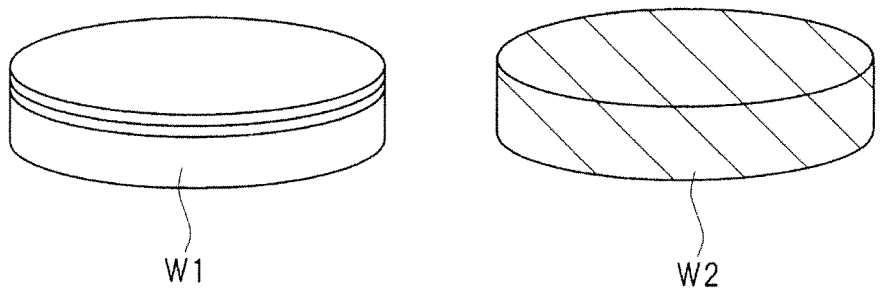
FIG. 2 is a bird's-eye view illustrating a manufacturing method of a semiconductor device according to First Embodiment of the invention.
Figure 5:
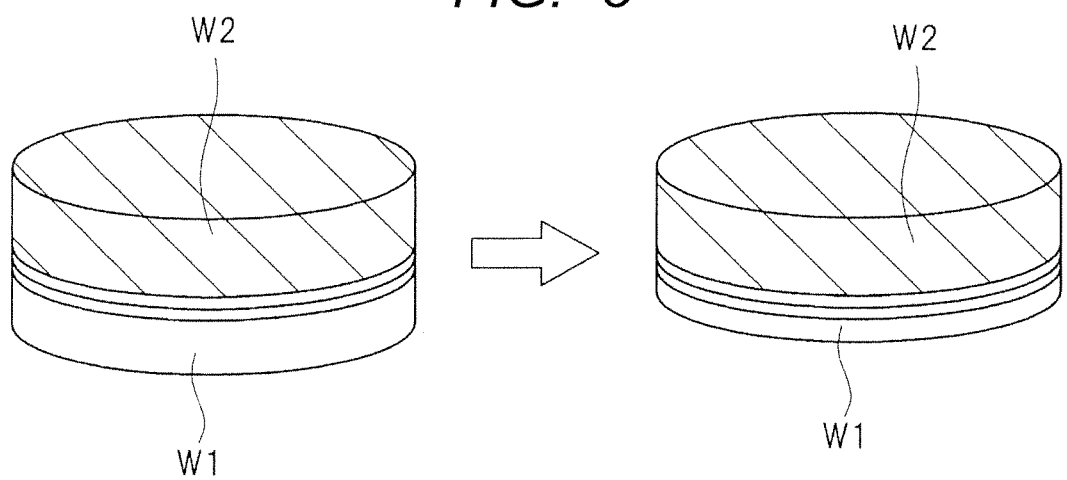
FIG. 5 is a bird's-eye view illustrating the manufacturing method of a semiconductor device according to First Embodiment of the invention.

Subsequently, a device (semiconductor element) including the backside illumination CMOS image sensor is formed over the first wafer (Step S2 of FIG. 1). FIG. 2 illustrates bird's-eye views respectively illustrating: a first wafer W1 in which the aforementioned device including a photodiode, a transistor, and a wiring layer is formed on the main surface side of an SOI substrate; and a second wafer W2 provided separately from the first wafer W1. In FIG. 2 and FIG. 5 described later, hatching lines are drawn on the surface of the second wafer W2 for easy understanding of the views.

Figure 3:
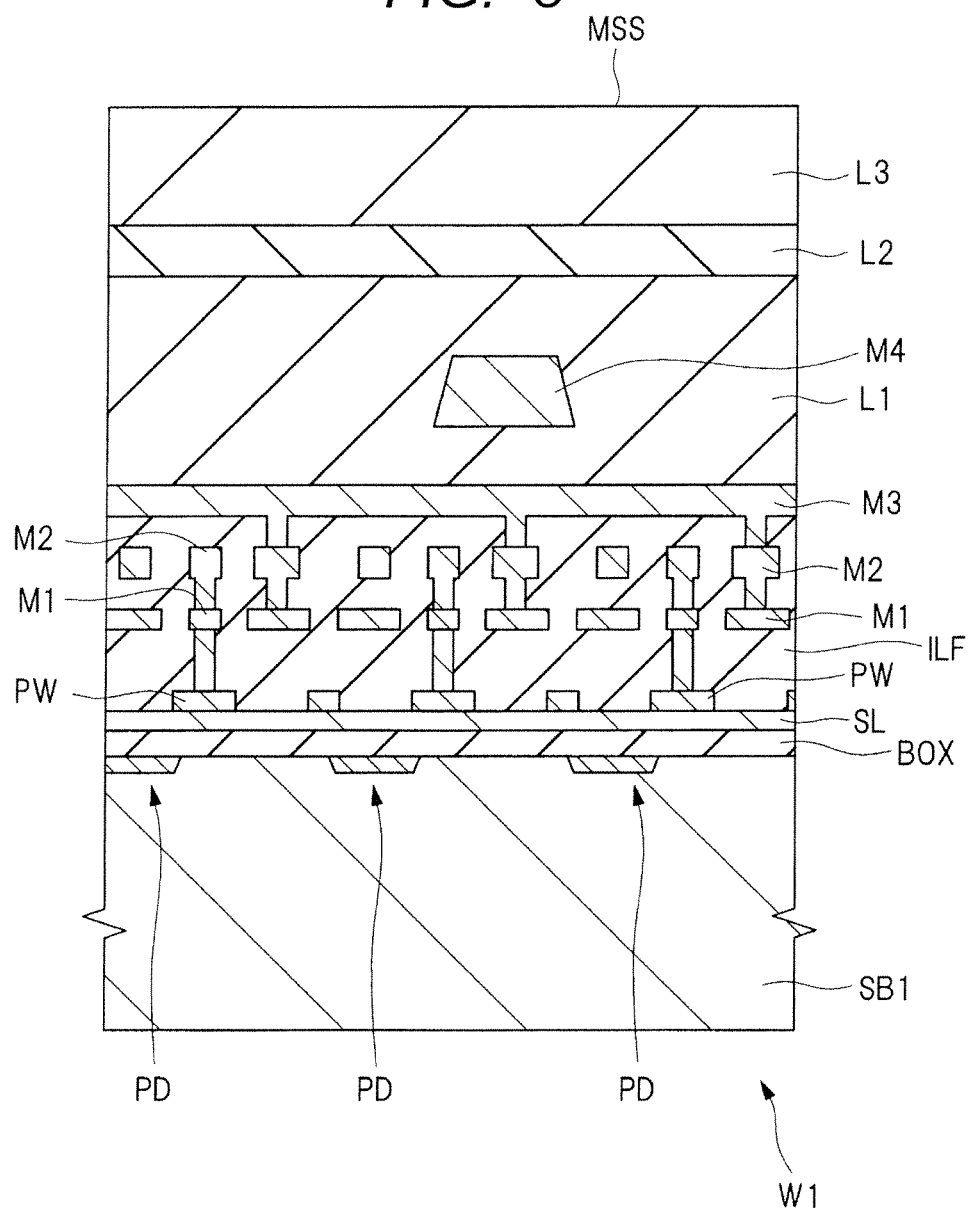
FIG. 3 is a sectional view illustrating the manufacturing method of a semiconductor device according to First Embodiment of the invention.

FIG. 3 illustrates a section of the first wafer W1 including a device structure formed in Step S2 of FIG. 1. The device structure will be described hereinafter, but major characteristics of the present embodiment are present in the steps performed after the formation of the device and before the completion of the bonding of the two wafers, and hence detailed description of the step of forming the photodiode, etc., over the first wafer W1 will be omitted herein.

As illustrated in FIG. 3, a silicon layer SL is formed, via an embedded oxide film BOX, over the main surface of a semiconductor substrate SB1 that forms the first wafer (first semiconductor substrate) W1. The first wafer W1 includes the semiconductor substrate SB1, the embedded oxide film BOX, and the silicon layer SL. A plurality of photodiodes PD are formed in the upper surface of the semiconductor substrate SB1, and polysilicon wirings PW, each of which is electrically coupled to the photodiode PD, and other transistors (not illustrated) are formed over the first wafer W1. The photodiode PD is comprised of an n-type semiconductor layer and a p-type semiconductor layer that are formed over the main surface of the silicon layer SL.

The polysilicon wiring PW is covered with an interlayer insulating film ILF over the main surface of the first wafer W1. The interlayer insulating film ILF is comprised of a laminated film formed by a plurality of insulating films (not illustrated), and a plurality of wirings M1 to M3 formed above the polysilicon wiring PW are formed in the interlayer insulating film ILF. The polysilicon wiring PW and the wiring M1, the wiring M1 and the wiring M2, and the wiring M2 and the wiring M3 are electrically coupled to each other through vias, respectively.

An insulating film L1 including, therein, a wiring M4 comprised of an aluminum film is formed over the wiring M3. The insulating film L1 is comprised of a plurality of laminated insulating films (not illustrated), and the wiring M4 is electrically coupled to the wiring M3. Insulating films L2 and L3 are laminated in this order over the insulating film. L1. Each of the insulating films L1 to L3 is comprised, for example, of a silicon oxide film and is formed, for example, by a CVD (Chemical Vapor Deposition) method. The insulating film L3 is an adhesive layer, the upper surface MSS of which will be bonded to the second wafer in a subsequent step (Step S6 of FIG. 1), and the insulating film L3 may be formed by a silicon nitride film or a silicon film, without being limited to a silicon oxide film. The aforementioned device illustrated in FIG. 3 is formed by a commonly-known semiconductor manufacturing process. For convenience, the whole of the structure described with reference to FIG. 3 is referred to as the first wafer W1 hereinafter.

Subsequently, a cleaning treatment is performed as illustrated in Step S3 of FIG. 1, in which a surface of each of the first wafer and the second wafer that will be attached together in the subsequent step (Step S6), is cleaned, the surface becoming an attached interface. That is, the surface on the main surface side of the first wafer and that on the main surface side of the second wafer are cleaned. In the aforementioned cleaning step, a cleaning method can be used, in which the surface of a wafer is cleaned with pure water (DIW: De-Ionized Water), i.e., cleaned by making flow pure water from above the wafer toward the center thereof. Alternatively, an ultrasonic cleaning method may be used as another method.

The surface of the first wafer that is to be attached is the surface on the side in which the device is formed, i.e., the upper surface on the main surface side. That is, the upper surface MSS of the insulating film L3 (see FIG. 3) formed on the main surface side of the first wafer is cleaned herein. The upper surface MSS of the insulating film L3 is polished, for example, by a CMP (Chemical Mechanical Polishing) method, etc., or is made flat by an etching method. In such a case, a foreign substances (particle), etc., such as a residue resulting from a polishing step or etching step, remains over the upper surface MSS of the insulating film L3. If a foreign substance remains over the surface of a wafer, a gap is caused when two wafers are attached together, because the foreign substance is interposed between the two wafers, thereby making it difficult to attach them together. Accordingly, it is needed to remove the foreign substance by the aforementioned cleaning step.

As described above, the bonding surface of the first wafer, i.e., the surface of the insulating film L3 illustrated in FIG. 3 may be formed by a silicon nitride film or a silicon film without being limited to a silicon oxide film. In addition, a device including a semiconductor element, etc., a wiring, or the like may be formed over the main surface of the second wafer or the back surface opposite to the main surface thereof. Herein, the bonding surface of the second wafer may be formed by a silicon oxide film or a silicon nitride film without being limited to a silicon film, similarly to the first wafer. That is, when the first wafer and the second wafer are bonded together, combinations of the materials for the films of the bonding surfaces that face each other include, for example, a silicon film and a silicon film, a silicon oxide film and a silicon film, a silicon oxide film and a silicon oxide film, a silicon nitride film and a silicon film, and a silicon oxide film and a silicon nitride film, etc.

Subsequently, a degassing treatment is performed, in which moisture or a gas component (adsorbed substance), which is adsorbed to the surfaces of the first wafer and the second wafer that are attached together in the subsequent step (Step S6), is removed as illustrated in Step 4 of FIG. 1. Herein, the adsorbed substance over the surfaces of the first wafer and the second wafer is removed by performing a heat treatment on each of the wafers with the use of a heating device in which a lamp, such as a xenon lamp, or a heater using a carbon wire, or the like is used. A large amount of moisture is adhered or absorbed particularly to the surface of the first wafer due to the cleaning step in Step S3. A silicon oxide film or the insulating film L3 comprised of a silicon oxide film (see FIG. 3) is formed over the upper surface of the first wafer, and such an insulating film has a property in which moisture is more likely to be adsorbed in comparison with the second wafer comprised of a monocrystalline silicon.

Objects to be removed from each of the wafers by the heat treatment includes, other than water ($H_2O$), an foreign substance that is generated with a residual gas and water, which are adhered to the surface (upper surface MSS) of the insulating film L3 comprised of a silicon oxide film (see FIG. 3), being reacted with each other when the insulating film L3 is formed over the upper surface of the first wafer in, for example, Step S2.

In a degassing step by the heat treatment in Step S4, the heat temperature is required to be made to be 100° C. or higher, which is the boiling point of water, in order to remove moisture, etc. The aforementioned heating step is performed by using a lamp or a heater in a chamber after the wafer is brought into the chamber. Examples of the method of checking whether moisture or other impurities have been removed sufficiently from the wafer include: a method of measuring the temperature of the wafer while being raised; that of measuring the pressure in the chamber; and that of inspecting the components of desorbed gases discharged from the chamber by a mass spectrograph.

As described above, when the wafer is subjected to a heat treatment at a sufficient temperature and a sufficient period of time by managing and monitoring the temperature of the wafer while being raised, it can be determined that moisture, etc., is sufficiently desorbed from the surface of the wafer. When the pressure in the chamber is measured, a vacuum degree in the chamber whose pressure is reduced, for example, by continuously discharging gases therein, is measured by using a vacuum gauge. Then, the moisture adsorbed to the surface of the wafer is vaporized and expanded by being heated, and hence the pressure in the chamber is increased. When the heating and discharge of gases in the chamber are further continued, the pressure in the chamber is reduced, and hence an effect of the degassing treatment (heat treatment) can be checked and it can be determined when the degassing treatment is completed by detecting a change in the pressure.

Further, it can be determined, by inspecting the components of the desorbed gases, that moisture and other gases are discharged and it can be determined, by measuring the amounts of the moisture and the other gas gases, when the degassing treatment is completed. Among the above methods, the method of measuring the pressure in the chamber can be practiced, in particular, from the viewpoint of low cost. A major characteristic of the present embodiment is that moisture, etc., over the surface of the wafer is removed by performing the aforementioned heat treatment in Step S4.

In addition, as a method of performing degassing in Step S4, either of the following two methods may be adopted, other than the method of raising the temperature of the wafer to 100° C. or higher, as described above: a method of maintaining a reduced-pressure atmosphere at a vacuum degree of approximately 100 Pa or lower; and a method of raising the temperature of the wafer to 100° C. or higher while maintaining a reduced-pressure atmosphere at a vacuum degree of approximately 100 Pa or lower.

Subsequently, the surface of each of the first wafer and the second wafer is activated by subjecting it to a plasma treatment at a reduced-pressure, as illustrated in Step S5 of FIG. 1. By activating the surface of each wafer with the use of the plasma treatment, the wafers can be easily attached together and the bonding force after the bonding can be enhanced. Temporary bonding between the wafers is performed by using the wettability of the surface of the wafer. Herein, the hydrophilicity of the surface thereof is improved by performing the aforementioned plasma treatment and cleaning treatment, and hence the wafers can be further firmly adhered together when being attached together. Alternatively, the activation treatment in Step S5 may be performed before either of the cleaning step illustrated in Step S3 and the degassing step illustrated in Step S4. The plasma treatment in Step S5 is performed by using an oxygen plasma or nitrogen plasma under, for example, $N_2$ (nitrogen) or $O_2$ (oxygen) atmosphere;

or by using a plasma in an inert gas, such as Ar (argon), He (helium), or the like, or a plasma in an atmosphere in which the inert gas and a hydrogen gas are mixed.

Subsequently, the first wafer and the second wafer are temporarily bonded together by attaching them together, as illustrated in Step S6 of FIG. 1. The temporary bonding is performed by using the wettability of the surfaces of the wafers that face each other, as described above. That is, the wafers are bonded together by generating a small bonding force due to the van der Waals force between the surfaces of the wafers. The temporary bonding step is performed at room temperature (normal temperature). The room temperature (normal temperature) referred to in the present application means, for example, a temperature of approximately 25° C.

Subsequently, the first wafer and the second wafer, which have been temporarily bonded together in Step S6, are permanently bonded together by heating the wafers to a temperature of 200° C. or higher to improve the bonding strength, as illustrated in Step S7 of FIG. 1. The temperature applied to the wafers in the heating step is made to be, for example, 200 to 1000° C., and herein is made to be 300° C. The bonding surfaces of the first wafer and the second wafer are firmly bonded together by the aforementioned heating step. Thereby, the step of attaching the wafers together is completed.

Figure 10:
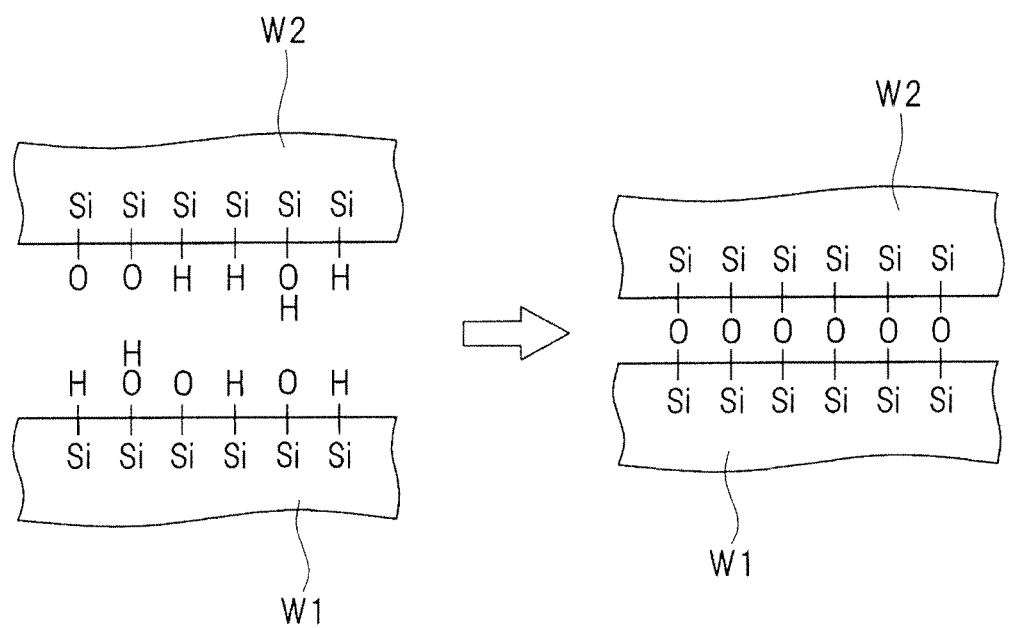
FIG. 10 is a schematic view illustrating surface states of wafers during manufacturing steps of a semiconductor device illustrated as a comparative example.

When the plasma treatment in Step S5 is not performed, a large number of H (hydrogen) and O (oxygen) are present over the surface of each of the wafers and they are bonded together by a small van der Waals force, as illustrated in FIG. 10. In order to permanently bond together the wafers each having such a surface state, it is needed to perform a heat treatment at a relatively high temperature of approximately 1000° C. Si—O—Si covalent bonds are formed between the first wafer W1 and the second wafer W2 by this heat treatment, so that the wafers are firmly bonded together. In FIG. 10, surface states of the wafers, occurring when they are temporarily bonded together (which corresponds to Step S6 of FIG. 1), are illustrated on the left side of the view, and a state of the boundary between the wafers, occurring after a heat treatment is performed to permanently bond them together (which corresponds to Step S7 of FIG. 1), is illustrated on the right side thereof. FIG. 10 is a schematic view illustrating surface states of the wafers during manufacturing steps of a semiconductor device illustrated as a comparative example.

Figure 4:
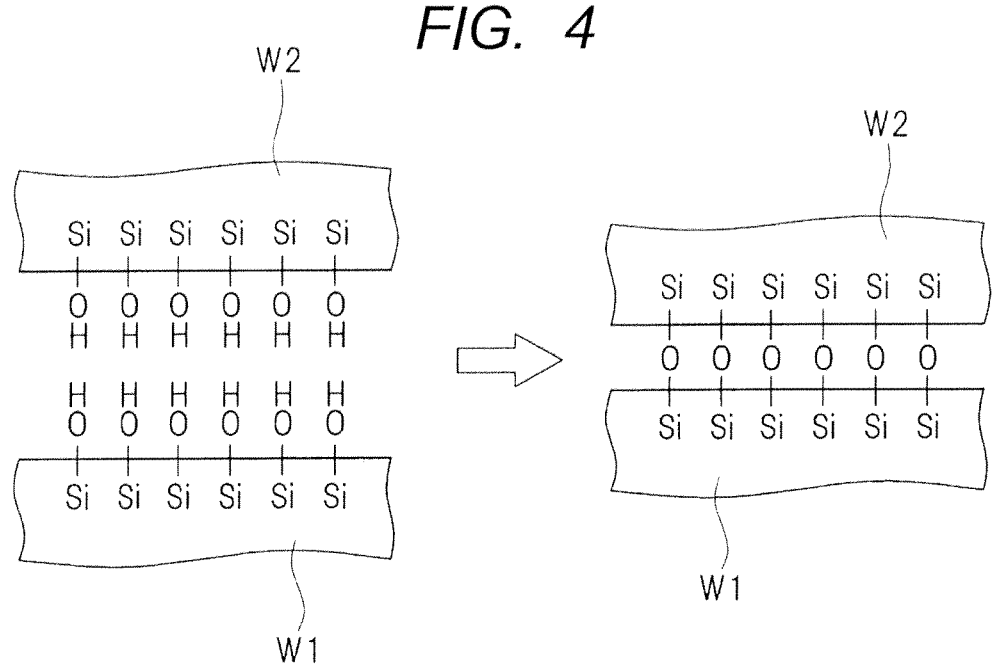
FIG. 4 is a schematic view illustrating surface states of wafers during the manufacturing steps of a semiconductor device according to First Embodiment of the invention.

On the other hand, in the present embodiment, Si—O—H structures are aligned over the surface of the wafer by activating the surface thereof with the use of the plasma treatment illustrated in Step S5 of FIG. 1, as illustrated on the left side of FIG. 4. In the temporary bonding step in Step S6, the first wafer and the second wafer are bonded together by a small force resulting from the van der Waals force. When the Si—O—H structures are aligned over the surface of the wafer, a covalent bond can be formed between the first wafer and the second wafer even by a heat treatment performed at a relatively low temperature of approximately 200 to 300° C., and hence the wafers can be firmly bonded together. In the present application, bonding in a state where a bonding force between wafers is larger than that in a temporarily bonding state is referred to as permanent bonding.

FIG. 4 illustrates, on the left side thereof, surface states of the wafers, occurring when they are temporarily bonded together (Step S6 of FIG. 1), while illustrates, on the right side thereof, a state of the boundary between wafers, occurring after the heat treatment is performed to permanently bond them together (Step S7 of FIG. 1). FIG. 4 is a schematic view illustrating surface states of the wafers of a semiconductor device during the manufacturing steps according to the present embodiment.

Subsequently, a step of making the wafer to be thin and the subsequent steps following the step of forming a device are performed, as illustrated in Step S8 of FIG. 1. Specifically, the back surface of the first wafer W1 is first retreated by polishing, etc., the back surface in order to make the first wafer W1, which has been bonded to the second wafer W2, to be thin, as illustrated in FIG. 5. In the view, a bird's-eye view illustrating the first wafer W1 and the second wafer W2 that are bonded together in Step S7 of FIG. 1 is illustrated on the left side, and a bird's-eye view illustrating them, the first wafer W1 of which has been made to be thin by the polishing step in Step S8 of FIG. 1, is illustrated on the right side.

Figure 6:
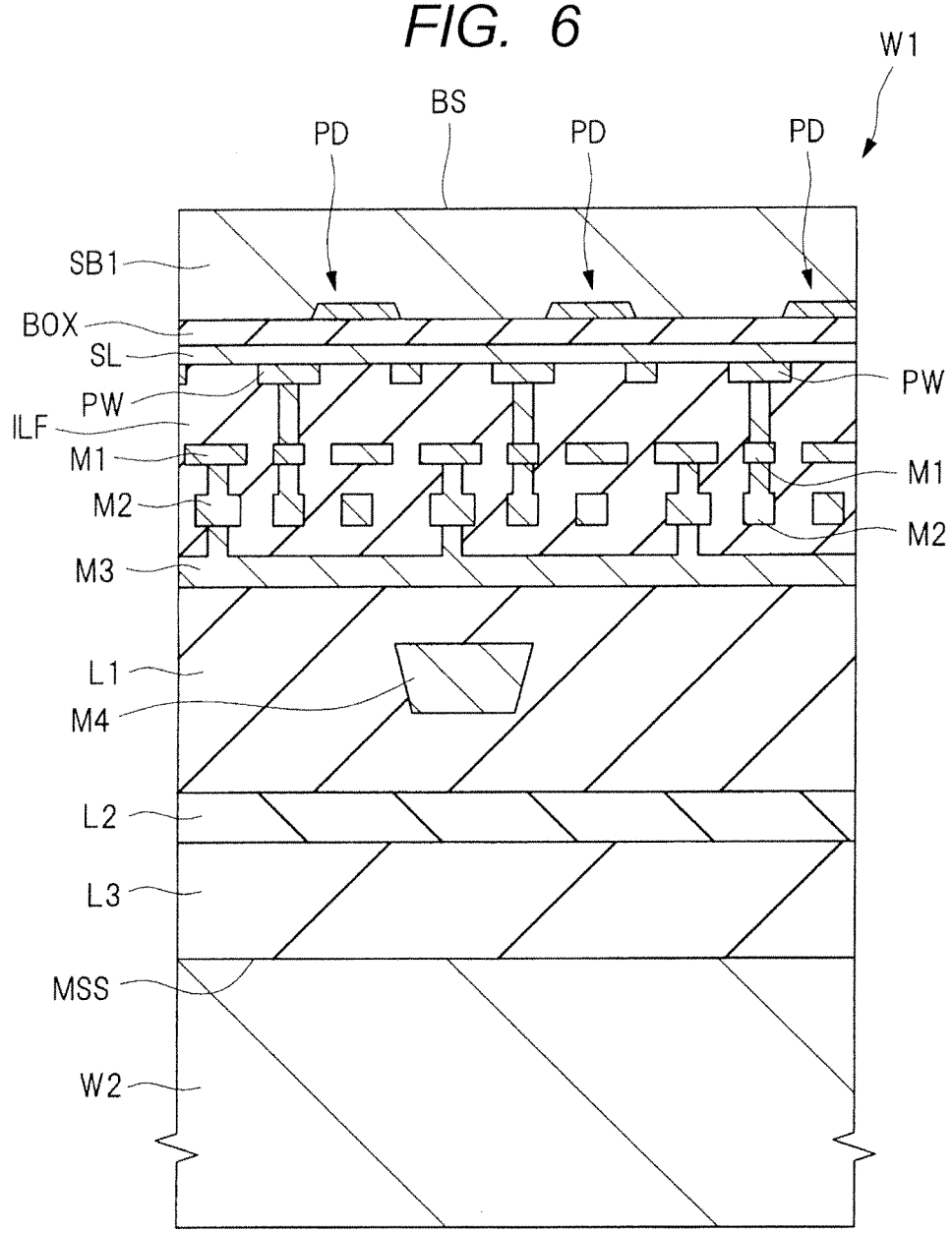
FIG. 6 is a sectional view illustrating the manufacturing method of a semiconductor device according to First Embodiment of the invention.

FIG. 6 is a view illustrating a section of the first wafer W1 after the aforementioned polishing step is performed. In the sectional view of FIG. 6, the bird's-eye view in FIG. 5 is illustrated in an upside-down state. That is, the thinned first wafer W1 is bonded over the second wafer W2. In the polishing step performed in Step S8 of FIG. 1, the back surface of the semiconductor substrate SB1 is retreated by a back grinding method, a CMP method, or a combination thereof, so that the semiconductor substrate SB1 is made to be thin. Thereby, the thickness of the semiconductor substrate SB1 is made to be approximately 3 µm, and the thickness of the semiconductor substrate SB1 through which the light, emitted from a back surface BS side of the first wafer W1, is transmitted before reaching the light receiving part is made to be small, thereby preventing a decrease in an amount of received light.

FIG. 6 illustrates a section in which the first wafer W1 illustrated in FIG. 3 is bonded, in an upside-down state, over the second wafer W2. Although the back surface BS side of the semiconductor substrate SB1, located on the lower side of FIG. 3, is illustrated in the uppermost position in FIG. 6, the uppermost surface of the view illustrated in FIG. 6 is herein referred to as the back surface BS of the semiconductor substrate SB1. The back surface of the wafer (semiconductor substrate) referred to in the present application means a surface opposite to the surface on the main surface side of the wafer. For example, the back surface of the first wafer W1 is the surface opposite to the surface (main surface) on the side in which the photodiode PD and the wirings M1 to M3, etc., in the first wafer W1 including the semiconductor substrate SB1 are formed.

Figure 7:
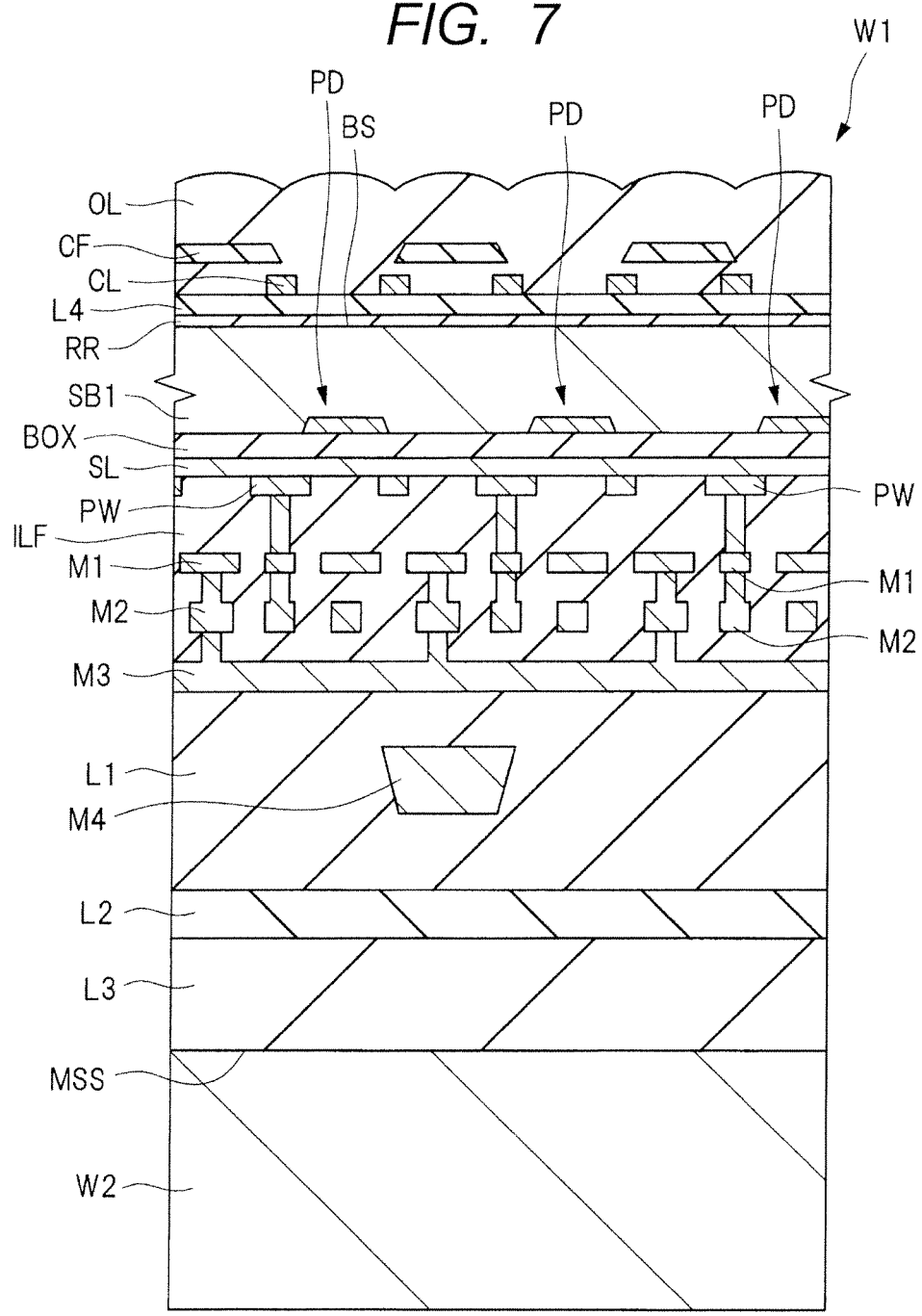
FIG. 7 is a sectional view illustrating the manufacturing method of a semiconductor device following FIG. 6.

Subsequently, an anti-reflection film RR comprised of a Hf (hafnium) film or a silicon nitride film, an insulating film L4 comprised of a silicon oxide film, and a light-shielding film CL comprised of a plurality of patterns of tungsten films or aluminum films that shield light, are sequentially formed over the back surface BS of the semiconductor substrate SB1, as illustrated in FIG. 7. Thereafter, by forming, over the insulating film L4, an on-chip lens OL comprised of an organic film including a color filter CF in the inside thereof, Step S8 of FIG. 1 is completed, thereby allowing a semiconductor device including a backside illumination CMOS image sensor according to the present embodiment to be completed. The concavities and convexities over the upper surface of the on-chip lens are formed, for example, by a photolithography technique, an etching technique, or the like using a half-tone mask.

The image sensor formed by the manufacturing method according to the present embodiment is an element in which, when light is emitted from above the on-chip lens OL illustrated in FIG. 7, the light transmitted through the on-chip lens OL, the insulating film L4, the anti-reflection film RR, and the semiconductor substrate SB1 can be converted into electrons by photoelectric conversion occurring after the photodiode PD takes in the transmitted light.

In the present embodiment, the case has been described, in which the surface of the insulating film L3 (see FIG. 3) comprised of a silicon oxide film, which is formed on the main surface side of the first wafer, and the surface of the second wafer comprised of a monocrystalline silicon substrate are coupled to each other; however, the insulating film L3 may be comprised of a silicon film, as described above. In addition, a silicon film may be formed on the main surface side of the first wafer and a silicon oxide film may be formed on the main surface side of the second wafer. That is, when two wafers are bonded together, the following cases can be considered: the case where the surface of a silicon oxide film and that of a silicon film are bonded together; and the case where the surfaces of silicon films are bonded together.

Hereinafter, advantages of the present embodiment will be described.

In manufacturing steps of a semiconductor device including a step of attaching two wafers together, it can be considered that two wafers, the surfaces of which have been cleaned with pure water, etc., are temporarily bonded together and then firmly bonded by performing a heat treatment at a high temperature of approximately 200 to 1000° C., without performing a degassing treatment by the heat treatment in Step S4 of FIG. 1. However, when a degassing treatment (heat treatment) is not performed, gas components, etc., such as water, remain in the boundary between the wafers. If a heat treatment for permanent bonding is performed after such wafers are temporarily bonded together, a void is caused between the wafers by the moisture being expanded, thereby causing the problem that the reliability of a semiconductor substrate is decreased.

That is, if moisture, another gas, or the like is adsorbed to the bonding surfaces of the first wafer and the second wafer, the moisture is expanded when vaporized due to a high-temperature heat treatment corresponding to Step S7 of FIG. 1 in the present embodiment, thereby causing the fear that a void may be formed between the wafers. If a void is formed between the first wafer and the second wafer, the bonding strength between the wafers is decreased. If the second wafer is peeled off from the first wafer, the strength of the first wafer, the thickness of which has been made small to be approximately 3 μm, cannot be maintained, thereby causing a fear of being damaged. As described above, if wafers are bonded together in a state where moisture, etc., remains between the wafers, the bonding strength between the wafers cannot be sufficiently maintained, and hence the reliability of a semiconductor device is decreased.

As described above, the following two cases can be considered when two wafers are bonded together: the case where the surface if a silicon oxide film and that of a silicon film are bonded together; and the case where the surfaces of silicon films are bonded together. In addition, other than those, the following three cases can be considered: the case where the surfaces of silicon oxide films are bonded together; the case where the surface of a silicon film and that of a silicon nitride film are bonded together; and the case where the surface of a silicon oxide film and that of a silicon nitride film are bonded together.

The aforementioned voids are caused more remarkably in the case where the surfaces of silicon films are bonded together than in the case where the surface of a silicon oxide film and that of a silicon film are bonded together. This is because a silicon oxide film has a characteristic in which moisture is likely to be absorbed and hence the moisture is diffused and absorbed, thereby suppressing a void from occurring. Accordingly, occurrence of a void can be suppressed by using a silicon oxide film in a bonding surface.

However, a silicon oxide film having absorbed moisture has the problems that: a breakdown is likely to be caused; and a leak current is likely to be caused between wirings. Accordingly, a silicon oxide film has a low function as an insulating film. In addition, the moisture in a silicon oxide film corrodes a metal wiring located near to the silicon oxide film (e.g., the wiring M4 illustrated in FIG. 7) by reacting with the metal wiring, thereby causing the fear that: the resistance of the wiring may be increased; or a disconnection may be caused. The use of a silicon oxide film has no problem itself, but if two wafers are bonded together in a state where moisture is adsorbed to the films of the wafers, the aforementioned problems are caused.

Alternatively, it can be considered that two wafers are bonded together by using, for example, an adhesive, without using a heat treatment performed at a high temperature of, for example, 100° C. or higher, the heat treatment corresponding to Step S7 according to the present embodiment. In this case, however, if moisture, etc., remains over the surfaces of the wafers to be bonded, the problem that bonding strength is more decreased than in the case where the moisture is removed. In addition, if a silicon oxide film is provided over the bonding surface even when the wafers are bonded together with an adhesive, problems are caused, in which the insulation property of the silicon oxide film is decreased and the metal wiring is corroded by moisture being absorbed into the silicon oxide film, as described above.

Accordingly, in either of the cases: where the surface of a silicon oxide film and that of a silicon film are bonded together; and where the surfaces of silicon films are bonded together, it is needed to remove moisture, etc., from the surfaces of wafers before the wafers are bonded together.

Accordingly, in the present embodiment, the moisture, etc., over the bonding interface between the wafers are removed by performing degassing with the use of a heat treatment in Step S4. Thus, by desorbing the moisture and other gas components, which have been adsorbed to the surfaces of the first wafer and the second wafer, at a high temperature of 100° C. or higher and thereafter by performing a temporary bonding step and a heat treatment step for permanent bonding, it can be prevented that a void may be formed between the wafers by the moisture that remains over the surfaces of the wafers being expanded due to the heat treatment step. Thus, by controlling the temperatures of two wafers before the wafers are attached together and by managing the surface states of the wafers after the wafers are cleaned, it can be prevented that the bonding strength between the bonded wafers may be decreased, and the reliability of a semiconductor device can be improved.

The aforementioned advantages can be remarkably acquired when the bonding surfaces of the first wafer and the second wafer are the surfaces of silicon films. This is because, when silicon films are bonded together, it is more difficult to suppress a void from occurring than when a silicon oxide film is provided over the bonding surface of the wafer, as described above. However, the aforementioned advantages can be acquired even when a silicon oxide film is provided over the bonding surface of the wafer, as in the present embodiment. In that case, a decrease in the insulation property of the silicon oxide film or occurrence of corrosion of a metal wiring can be prevented by moisture being absorbed into the silicon oxide film.

Alternatively, the plasma treatment may be performed before the cleaning step, and thereafter the cleaning step, degassing step, temporary bonding step, and permanent bonding step may be performed in this order. That is, when performed after Step S2 for forming a bonding surface and performed before the temporary bonding step in Step S6, the activating step using a plasma treatment, which is illustrated in Step S5 of FIG. 1, may be performed either before or after the cleaning step in Step S3. The cleaning step in Step S3 may be performed either just before the degassing step in Step S3 or just before the plasma treatment step (activating step) in Step S5, or cleaning may be performed at each of both the steps.

It has been described above that the wafers are bonded together by using an adhesive; however, a CMOS image sensor is likely to be influenced by the impurities included in an adhesive, and there is a high fear that the performance thereof may be deteriorated by the impurities. Accordingly, it is not desirable to use an adhesive when wafers are attached together in the manufacturing steps of a CMOS image sensor. On the other hand, by adopting a bonding method in which an adhesive is not used, as in the bonding step according to the present embodiment, it can be prevented that the performance of an element may be deteriorated.

(Second Embodiment)

In the present embodiment, a manufacturing method of a semiconductor device will be described, in which, in a manufacturing method of a semiconductor device including a step of bonding two wafers, steps of degassing the wafers, temporarily bonding them, and permanently bonding them, etc., and conveyance of the wafers between those steps are performed under a managed reduced-pressure.

Figure 8:
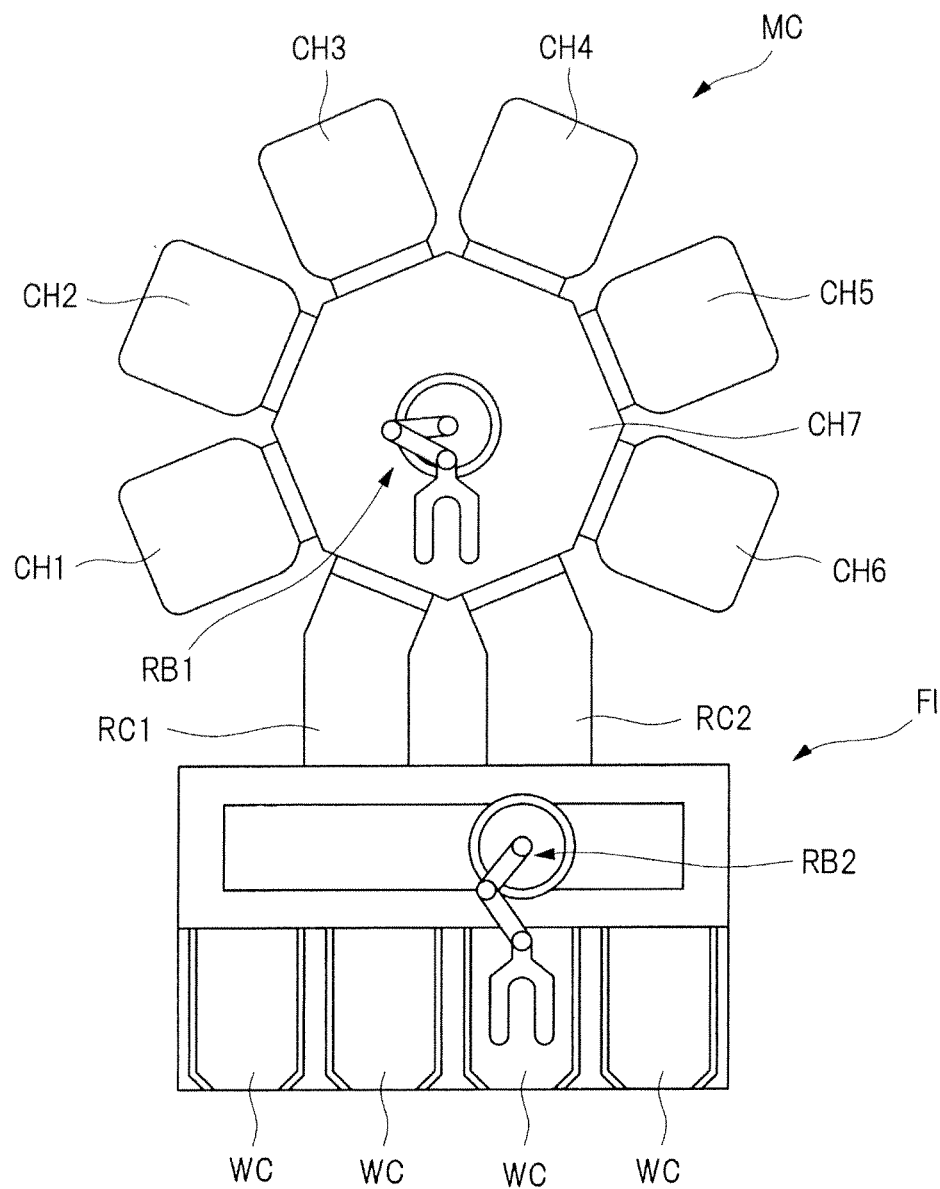
FIG. 8 is a schematic view illustrating an apparatus to be used in manufacturing steps of a semiconductor device according to Second Embodiment of the invention.

FIG. 8 is a schematic view illustrating a multi-chamber apparatus to be used in the bonding of wafers performed in the present embodiment. A multi-chamber apparatus MC illustrated in FIG. 8 has a conveying chamber CH7 at its center, and a plurality of process chambers are coupled to the periphery of the conveying chamber. Specifically, a degassing chamber CH1, a plasma treatment chamber CH2, a wafer temperature control chamber CH3, a wafer attaching chamber CH4, a wafer temperature control chamber CH5, a cleaning chamber CH6, and load lock chambers RC1 and RC2 are coupled to the conveying chamber CH7. A conveying robot RB1 is arranged in the conveying chamber CH7. The conveying robot RB1 is used for conveying a wafer among the process chambers that are circumscribed and the load rock chambers RC1 and RC2.

The multi-chamber apparatus MC is coupled to a factory interface FI via the load rock chambers RC1 and RC2. The factory interface FI includes a plurality of wafer storing cassettes WC and a conveying robot RB2. The conveying robot RB2 is arranged for conveying wafers between the wafer storing cassettes WC and the load lock chambers RC1 and RC2. The pressure in the factory interface FI is maintained at the atmospheric pressure.

When wafers are attached together by using this apparatus, the conveying robot RB2 conveys, of a plurality of wafers conveyed into the wafer storing cassettes WC, the first wafer and the second wafer separately into the load lock chambers RC1 and RC2, respectively. Subsequently, each of the first wafer and the second wafer is conveyed by the conveying robot RB1 in order to be processed in each of the process chambers in the multi-chamber apparatus MC. After being processed, both the wafers are bonded together and returned into the wafer storing cassette WC.

Figure 9:
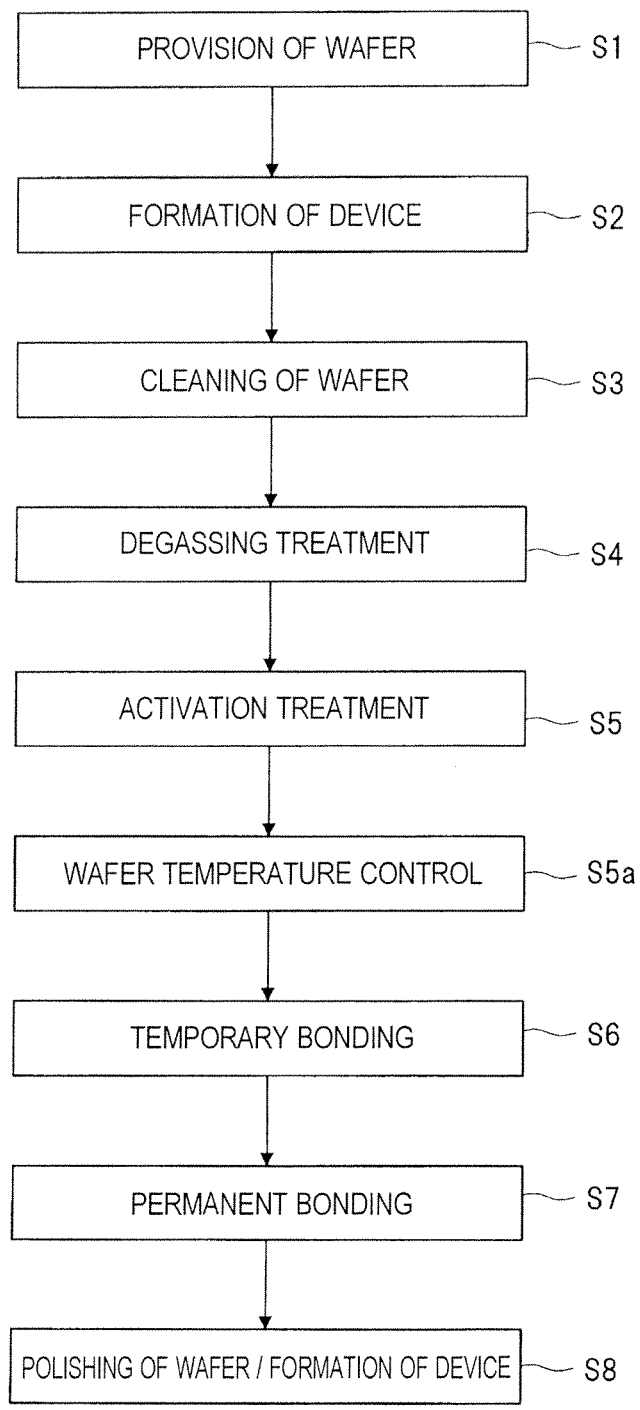
FIG. 9 illustrates a flow of the manufacturing steps of a semiconductor device according to Second Embodiment of the invention.

Hereinafter, a manufacturing method of a semiconductor device according to the present embodiment will be described along the flow illustrated in FIG. 9 and with reference to FIG. 8. As illustrated in FIG. 9, the steps performed in Steps S1, S2, S3, S4, S5, S6, S7, and S8 that are a flow according to the present embodiment, and the order in which these steps are performed are the same as those in First Embodiment. However, this Embodiment is different from the First Embodiment in that, in the steps between Step S4 and Step S7 (inclusive), the pressure and temperature in an apparatus in which the steps are performed are controlled.

A step of providing wafers in Step S1 of FIG. 9 and a step of forming a device in Step S2 are first performed, similarly to First Embodiment. Step S1 and Step S2 are performed outside the multi-chamber apparatus MC illustrated in FIG. 8. Subsequently, the first wafer and the second wafer are set in the wafer storing cassettes WC illustrated in FIG. 8, and they are then conveyed into the cleaning chamber CH6 by the conveying robots RB1 and RB2

Herein, the first wafer is first conveyed from the wafer storing cassette WC into the load lock chamber RC1 whose internal pressure is the atmospheric pressure (normal pressure), and the second wafer is conveyed into the load lock chamber RC2 whose internal pressure is the atmospheric pressure (normal pressure). Subsequently, the doors (not illustrated) between each of the load lock chambers RC1 and RC2 and the factory interface FI are closed, so that the inside of each of the load lock chambers RC1 and RC2 is made to be in a vacuum state by reducing the pressure thereof in a sealed state.

Subsequently, the doors (not illustrated) between the conveying chamber CH7 maintained in a vacuum (reduced-pressure) state and each of the load lock chambers RC1 and RC2 are opened, so that one of the wafers is conveyed into the cleaning chamber CH6 in a vacuum (reduced-pressure) state by the conveying robot RB1. Thereafter, the door (not illustrated) in the cleaning chamber CH6 is closed to control the pressure thereof to be normal pressure, and the cleaning step is then performed under normal pressure in order to remove a foreign substance (particle) adhered to the surface of the wafer (Step S3 of FIG. 9). After the cleaning is completed, the inside of the cleaning chamber CH is made to be in a vacuum state by reducing the pressure thereof, so that the wafer is returned from the cleaning chamber CH6 into the conveying chamber CH7.

The pressure in each of the degassing chamber CH1, the plasma treatment chamber CH2, the wafer temperature control chamber CH3, the wafer attaching chamber CH4, the wafer temperature control chamber CH5, and the conveying chamber CH7, all of which form the multi-chamber apparatus MC, is always maintained to be a reduced-pressure state, unlike the cleaning chamber CH6 and the load lock chambers RC1 and RC2.

Subsequently, the wafer having been subjected to the cleaning step S3 of FIG. 9 is conveyed into the degassing chamber CH1, so that the moisture and other gas components over the surface of the wafer are desorbed from the wafer by performing a high-temperature heat treatment using a xenon lamp, or the like (Step S4 of FIG. 9). Herein, when the degassing treatment is performed by raising the temperature of the wafer, the pressure in the degassing chamber CH1 is temporarily increased by moisture being vaporized and desorbed from the surface of the wafer. Herein, however, gases in the degassing chamber CH1 is continuously discharged to maintain the inside of the degassing chamber CH1 in a reduced-pressure atmosphere, and hence the increased pressure is gradually reduced and the inside thereof is again returned to the original reduced-pressure state.

As an apparatus to be used for the degassing, the degassing chamber CH1 is used, in which the internal pressure is reduced by continuously discharging internal gases. It is particularly important that moisture is removed as much as possible from the components in the atmosphere in the degassing chamber CH1. Accordingly, herein, the inside of the degassing chamber CH1 is made to be in a reduced-pressure state by discharging the gases in the degassing chamber CH1 by using a pump, etc., or the inside thereof is made to be in a reduced-pressure state under a nitrogen atmosphere, helium atmosphere, or argon atmosphere by supplying, into the chamber, an inert gas, such as $N_2$ (nitrogen) gas, He (helium) gas, Ar (argon) gas, or the like.

In such a degassing step, examples of a method of monitoring an amount of the desorbed gases include, as described in First Embodiment: a method of managing and controlling the temperature of the wafer by a wafer thermometer; a method of inspecting a vacuum degree in the degassing chamber CH1 by a vacuum gauge; and a method of inspecting the components of the desorbed gases discharged from the degassing chamber CH1 by a mass spectrograph.

Subsequently, the wafer is conveyed into the plasma treatment chamber CH2 in a state where the reduced-pressure atmosphere is maintained, so that the surface of the wafer is activated by subjecting the surface to a plasma treatment under a reduced-pressure (Step S5 of FIG. 9).

Subsequently, the wafer is conveyed into the wafer temperature control chamber CH3 in a state where the reduced-pressure atmosphere is maintained, so that the wafer is cooled to normal temperature (room temperature) or to another specific temperature (Step S5a of FIG. 9). Alternatively, without being limited to cooling, when the temperature of the wafer is too low, the wafer is heated in the wafer temperature control chamber CH3. Herein, when the wafer is cooled, a water cooling method is used, in which the wafer is cooled with a liquid (e.g., water) flowing through a stage by fixing, mechanically or with an electrostatic chuck, etc., the wafer to the stage. When the temperature of the wafer is raised, the wafer is heated by emission of a lamp light, etc.

Herein, the first wafer over which a device is formed is subjected to the aforementioned steps in Step S1 to Step S5a of FIG. 9, and the second wafer is also subjected to the steps in Step S3 to Step S5a, following the first wafer. Alternatively, in order to match both the timings in Step S5a when the temperature of the first wafer is controlled and when that of the second wafer is controlled, the first wafer may be conveyed into the wafer temperature control chamber CH3 and the second wafer may be conveyed into the wafer temperature control chamber CH5, so that the temperatures of the two wafers are controlled simultaneously. The temperatures of the first wafer and the second wafer become the same as each other just before the wafer attaching (temporary bonding) step (Step S6 of FIG. 9) by performing the temperature control step in Step S5a. Herein, a difference between the temperatures of the two wafers is made to be 50° C. or lower.

The reason why a difference between the temperatures of the first wafer and the second wafer to be attached together is made to be small as much as possible, as described above, is that a void is suppressed from occurring and a decrease in the performance of the device (e.g., generation of a leak current or a dark current), resulting from stress, is prevented by preventing a residual strain, occurring due to thermal expansion of the wafer, from occurring. The first wafer, over which the device is formed, has a complicated structure in which a plurality of layers including the insulating film, such as a nitride film, and the metal film are formed over the semiconductor substrate. Because these films have rates of expansion and rates of contraction resulting from a change in temperature, the rates being different from each other, and hence when the first wafer is extremely heated or cooled, stress-strain is caused in the first wafer and the first wafer warps itself.

If a warp is caused in the first wafer, it becomes difficult to attach the first wafer and the second wafer together by putting them closely to each other, and to maintain the bonding force between the wafers. In addition, it is important for an image sensor to align the position and performance of each photodiode, and hence if the position and performance of an element vary due to occurrence of internal stress or internal strain, the reliability of a semiconductor device is decreased. In addition, in a wafer having residual stress therein, there is the fear that a dark current may be caused in its internal circuit. Accordingly, in order to prevent stress or strain from occurring in the first wafer and to prevent it from warping itself, the temperature of the first wafer is controlled herein to be room temperature.

In addition, the first wafer includes films, such as a nitride film and a metal film, which have rates of expansion different from that of a silicon film, as described above, while the second wafer is comprised of only a monocrystalline silicon substrate. Accordingly, the structures of the first wafer and the second wafer are greatly different from each other, and hence internal stresses in the wafers, occurring due to changes in the temperatures of the wafers, are different from each other. In particular, if a difference is present between the temperatures of the wafers, a large difference is caused between the stresses in the wafers. Accordingly, if the step of attaching the wafers together is performed in a state where a large difference is present between the temperatures of the wafers, the wafers contract at rates of contraction different from each other when the attached wafers are returned to room temperature, thereby large internal stress and strain are caused between the first wafer and the second wafer.

Because such stress and strain greatly affect the performance of the image sensor, it is desirable that a difference between the temperature of each of the wafers to be bonded together and the temperature of the wafers, which are permanently bonded together and then returned to room temperature, is made to be small, from the viewpoint of preventing stress from occurring in the wafer. In addition, it is desirable to perform the step of attaching and bonding the first wafer and the second wafer together in a state where a difference between the temperatures of the two wafers is maintained to be small, from the viewpoint of preventing stress from occurring in the wafers.

Accordingly, in the present embodiment, the temperature of each wafer is adjusted, before the wafers are attached together, i.e., before Step S6 of FIG. 9, to room temperature in the wafer temperature control chamber CH3 illustrated in FIG. 8, the room temperature being the temperature after the wafers are attached together (Step S5a of FIG. 9). Herein, in order to make a difference between the stresses and strains occurring in the first wafer and the second wafer, adjustment is made to make the temperatures of the wafers to be the same as each other as much as possible (Step S5a of FIG. 9).

It has been described above that a difference between the temperatures of the wafers is made to be 50° C., but in particular, in order to achieve low strain, it is desirable that the difference between the temperatures thereof is made to be 10° C. or low and that a difference between in-plane temperatures of each of the wafers is made to be 10° C. or low. Herein, the temperatures of the first wafer and the second wafer are made to be, for example, 25° C., respectively.

Subsequently, after the first wafer and the second wafer are arranged in the wafer attaching chamber CH4 by conveying them through the multi-chamber apparatus MC whose inside pressure is maintained to be a reduced-pressure, the wafers are attached and temporarily bonded together (Step S6 of FIG. 9). At the time, the pressure in the wafer attaching chamber CH4 is maintained to be a vacuum (reduced-pressure) state lower than the atmospheric pressure. In addition, in order to make a difference between the temperatures of the wafers to be always small and to perform temperature control further precisely, the temperatures of the first wafer and the second wafer are controlled, even in the wafer attaching chamber CH4, before and during the attachment. As a temperature control method, a method similar to the aforementioned method using a stage or a lamp is adopted.

That is, when the wafers are attached together, temperature control is also performed such that the temperatures thereof are the same as each other. At the time, the temperatures thereof are made to be room temperature. When the wafers are attached together, it can be considered that, in order to achieve degassing for suppressing a failure, caused when the wafers are bonded together, from occurring, the wafers are attached together while the temperature thereof is being raised. In this case, however, residual stress is caused in the bonded wafers when they are returned to room temperature. On the other hand, in the present embodiment, occurrence of stress resulting from a difference between the rates of thermal expansion of the wafers or rates of contraction thereof, occurring when cooled, is prevented, and further occurrence of stress resulting from the fact that a plurality of types of films are present in the first wafer is prevented, and hence the wafers are attached together by controlling the temperatures thereof to be room temperature such that the first wafer and the second wafer are not excessively heated.

Subsequently, the wafer are permanently bonded together by heating them at a temperature of 200° C. or higher to improve the bonding strength between them (Step S7 of FIG. 9). Herein, temperature control is performed in the wafer attaching chamber CH4 such that the temperatures of the wafers, after the heat treatment for the permanent bonding, are the same as each other. Thereby, it is prevented that stress may be caused between the first wafer and the second wafer after the permanent bonding.

Subsequently, after the attached and bonded wafers are returned into the wafer storing cassette WC by conveying them outside the multi-chamber apparatus MC, the subsequent steps following the step of forming a device are performed, similarly in First Embodiment. That is, a backside illumination CMOS image sensor is completed by polishing the back surface a semiconductor substrate that forms the first wafer and by forming an on-chip lens, and the like (Step S8 of FIG. 9).

As described above, all of the steps between the completion of the cleaning step in Step S3 and the completion of the permanent bonding in Step S7 are continuously performed under a reduced-pressure atmosphere in the present embodiment; however, all of the steps between the completion of the cleaning step in Step S3 and the completion of the temporary bonding in Step S6 are continuously performed under a reduced-pressure atmosphere, and the permanent bonding in Step S7 may be performed by using another apparatus.

Herein, even when the steps are performed in a vacuum state in the respective process chambers coupled to the conveying chamber CH7, and even when degassing is performed by using the degassing chamber CH1, for example, according to Step S4 of FIG. 9, the wafers are exposed to the atmosphere in the conveying chamber CH7 when the pressure in the conveying chamber CH7 is always the atmospheric pressure and the conveying chamber CH7 is always under the atmosphere. When a wafer having been subjected to the heat treatment in the degassing chamber CH1 is conveyed under the atmosphere, moisture is again adsorbed to the wafer, because moisture, etc., is likely to be adsorbed to the heated wafer when it is cooled. Accordingly, occurrence of a void cannot be effectively prevented.

That is, unless all of the steps between the completion of the degassing treatment (Step S4 of FIG. 9) and the completion of the attachment of the wafers (Step S8 of FIG. 9) are performed and the wafers are conveyed among those steps under a vacuum (reduced-pressure) condition, i.e., under an atmosphere in which moisture is not included, there is the problems that: a void is caused in the interface between the bonded wafers; the silicon oxide film over the surface of the wafer is deteriorated; and the like. Accordingly, in the present embodiment, all of the steps after the cleaning step, which are performed in the multi-chamber apparatus MC, are performed under a reduced-pressure atmosphere, thereby allowing the reliability of a semiconductor device to be improved.

In addition, in order to reduce an amount of moisture as much as possible in the multi-channel apparatus MC, the inside of the apparatus is made to be in a vacuum state by discharging the gases therein and $N_2$ (nitrogen) gas, He (helium) gas, or Ar (argon) gas is supplied into the apparatus. Thereby, deterioration of the surface states of the wafers, occurring due to adherence of moisture, etc., to the wafers, can be prevented.

As described above, the pressure and atmosphere in the apparatus, in which the wafers are attached together, are controlled and the temperatures of the wafers are also controlled in the present embodiment. Thereby, the bonding strength between the wafers is further effectively enhanced in addition to the advantages similar to those in First Embodiment are acquired. In addition, it can be prevented that the reliability of a semiconductor device may be decreased due to occurrence of stress, etc., in the wafers.

(Third Embodiment)

In Second Embodiment, a manufacturing method of a semiconductor device, using an apparatus in which conveyance and treatments are performed under a reduced-pressure except in a cleaning chamber and a load lock chamber, has been described; in the present embodiment, however, the case will be described, in which a series of steps of attaching the wafers together are performed without the pressure in the apparatus being reduced, i.e., performed, for example, under the atmospheric pressure, and instead, the inside thereof is made to be an inert gas atmosphere.

In Second Embodiment, the pressure in the multi-chamber apparatus is reduced by discharging gases including moisture, etc.; however, when the inside of the apparatus is under an atmosphere in which moisture is not included, it is not necessarily needed that the inside thereof is under a reduced-pressure atmosphere from the viewpoint of preventing moisture from being adsorbed to the surfaces of the wafers. Accordingly, in the present embodiment, the steps, similar to those described with reference to FIG. 9 in Second Embodiment, are performed in a state where: the pressure in the multi-chamber apparatus MC illustrated in FIG. 8 is made to be the atmospheric pressure; and the inside of the apparatus MC is filled with an inert gas, such as $N_2$ (nitrogen) gas, He (helium) gas, Ar (argon) gas, or the like, or dry air excluding moisture, etc.

However, the pressure in an apparatus (plasma treatment chamber CH2 illustrated in FIG. 8), in which a wafer is subjected to a plasma treatment, is reduced when the plasma treatment is performed similarly in First Embodiment and Second Embodiment. Because the inside of the conveying chamber CH7 has normal pressure, it is not needed to make the inside of the cleaning chamber CH6 to be in a vacuum state, every time when the wafer is put into/taken out of the cleaning chamber CH6. This point is different from Second Embodiment.

In the present embodiment, it can be prevented that a gas component (moisture), etc., may be adsorbed to the surfaces of the wafers to be attached together, even when the inside of the multi-chamber apparatus is not made to be under a reduced-pressure atmosphere, and hence the advantages similar to those in Second Embodiment can be acquired. Further, it is not needed to maintain a reduced-pressure atmosphere in the multi-chamber apparatus and works for reducing and increasing the pressures in part of the chambers can be saved, and hence the manufacturing cost of a semiconductor device can be reduced.

The invention made by the present inventors has been described above based on preferred embodiments, but the invention should not be limited to the preferred embodiments, and it is needless to say that various modifications may be made to the invention within a range not departing from the gist of the invention.

For example, the step of attaching wafers together according to the preferred embodiments can be applied to a manufacturing method of a semiconductor device including a step of attaching wafers together, the semiconductor device including a backside illumination CMOS image sensor and other devices.

What is claimed is:

1. A manufacturing method of a semiconductor device comprising the steps of:
   (a1) providing a first semiconductor substrate and a second semiconductor substrate;
   (b1) cleaning a first surface on a main surface side of the first semiconductor substrate and a second surface on a main surface side of the second semiconductor substrate. wherein the cleaning comprises ultrasonic cleaning or cleaning with pure water;
   (c1) after the step (b1), desorbing adsorbed substances over the first surface of the first semiconductor substrate and over the second surface of the second semiconductor substrate;
   (d1) activating the first surface of the first semiconductor substrate and the second surface of the second semiconductor substrate;
   (e1) after the steps (c1) and (d1), attaching and temporarily bonding together the first surface of the first semiconductor substrate and the second surface of the second semiconductor substrate at a temperature of approximately 25° C.;
   (f1) after the step (e1), enhancing a bonding strength between the first semiconductor substrate and the second semiconductor substrate by subjecting both the semiconductor substrates to a heat treatment in a temperature range of 200 to 300° C.; and
   (g1) after the step (f1), making a thickness of the first semiconductor substrate to be small by polishing a back surface of the first semiconductor substrate,
   wherein, in the step (c1), moisture is removed from the first surface of the first semiconductor substrate and the second surface of the second semiconductor substrate by performing a heat treatment at a temperature of 100° C. or higher.

2. The manufacturing method of a semiconductor device according to claim 1 further comprising the step of:
   (a2) after the step (a1) and before the steps (b1) and (d1), forming a semiconductor element over the main surface of the first semiconductor substrate.

3. The manufacturing method of a semiconductor device according to claim 2,
   wherein the semiconductor element is an image sensor.

4. The manufacturing method of a semiconductor device according to claim 1,
   wherein all of conveyances of the first semiconductor substrate and the second semiconductor substrate, which are performed after the step (c1) and before the step (f1), are performed under a reduced-pressure atmosphere.

5. The manufacturing method of a semiconductor device according to claim 1,
   wherein the steps (c1) and (d1) are performed under a reduced-pressure atmosphere.

6. The manufacturing method of a semiconductor device according to claim 1,
   wherein in the step (c1), an effect due to the heat treatment is checked and completion of the treatment is determined by measuring a pressure and a gas component in an apparatus in which the heat treatment is performed.

7. The manufacturing method of a semiconductor device according to claim 1 further comprising the step of:
   (d2) after the steps (c1) and (d1) and before the step (e1), making temperatures of the first semiconductor substrate and the second semiconductor substrate to be room temperature.

8. The manufacturing method of a semiconductor device according to claim 1,
   wherein all of conveyance treatments of the first semiconductor substrate and the second semiconductor substrate, which are performed after the steps (b1), (c1), (e1), and (f1), and after the step (b1) and before the step (f1), are performed under an inert gas atmosphere having normal pressure.

9. The manufacturine, method of a semiconductor device according to claim 1,
   wherein one of the first surface of the first semiconductor substrate and the second surface of the second semiconductor substrate includes a surface of a silicon film or a surface of a silicon oxide film, and the other of both the surfaces includes a surface of silicon film, a surface of a silicon oxide film, or a surface of a silicon nitride film.

10. The manufacturing method of a semiconductor device according to claim 1,
    wherein, in the step (b1), the first surface of the first semiconductor substrate is polished, and
    wherein, in the step (e1), the first surface of the first semiconductor substrate, which has been polished in the step (b1), and the second surface of the second semiconductor substrate are attached together.

11. The manufacturing method of a semiconductor device according to claim 1, wherein, in the step (d1), the first surface of the first semiconductor substrate and the second surface of the second semiconductor substrate are activated by performing a plasma treatment.

\* \* \* \* \*